United States Patent [19]

Hartmann

[11] Patent Number: 4,491,757
[45] Date of Patent: Jan. 1, 1985

[54] TRANSVERSELY WEIGHTED SURFACE ACOUSTIC WAVE DEVICE

[75] Inventor: Clinton S. Hartmann, Carrollton, Tex.

[73] Assignee: R F Monolithics, Inc., Dallas, Tex.

[21] Appl. No.: 491,080

[22] Filed: May 3, 1983

[51] Int. Cl.³ .............................................. H03H 9/25
[52] U.S. Cl. ............................ 310/313 B; 310/313 C; 333/154; 333/196
[58] Field of Search ........... 310/313 R, 313 B, 313 C, 310/154; 333/150, 151, 153, 154, 194–196

[56] References Cited

U.S. PATENT DOCUMENTS

| | | | |
|---|---|---|---|
| 3,551,837 | 12/1970 | Speiser | 333/154 |
| 3,800,248 | 3/1974 | Speiser | 333/154 |
| 4,143,340 | 3/1979 | Hunsinger | 310/313 B |
| 4,263,571 | 4/1981 | Kinoshita et al. | 333/194 |

*Primary Examiner*—J. D. Miller
*Assistant Examiner*—D. L. Rebsch
*Attorney, Agent, or Firm*—Kanz, Scherback & Timmons

[57] ABSTRACT

A surface wave device includes a substrate (12 in FIG. 7) having a surface layer of piezoelectric material (14), at least one pair of opposing electrically conducting pads (16 and 18) and at least two electrodes (20 and 22) which generate surface waves that vary significantly in strength in a direction transverse to the opposing pads. An ungrounded pad (16) forms an electrode array of parallel segmented electrodes (24), joined by electrically conducting connecting bars (26), having more segmented electrodes near the center of the transverse distance than near the pads. A grounded electrode (22) forms a segmented electrode array having segmented electrodes (44) joined by electrically conducting connecting bars (46) having fewer segmented electrodes near the center of the transverse distance than near the pads. In one arrangement, the pads and electrodes form an input transducer and the device includes an output transducer and a wave guide for guiding surface acoustic waves between the input transducer and the output transducer.

13 Claims, 10 Drawing Figures

TRANSVERSELY WEIGHTED SURFACE ACOUSTIC WAVE DEVICE

DESCRIPTION

1. Technical Field

The present invention relates generally to acoustic surface wave devices and in one of its aspects to a new method and apparatus for shaping the surface acoustic waves. In another of its aspects, the invention relates to a method and apparatus for guiding the waves.

2. Background Art

Figure 1A:
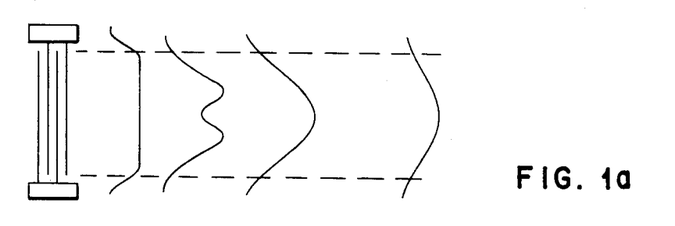
FIG. 1a is a graphic representation of a surface wave propagating on a free surface.
Figure 2:
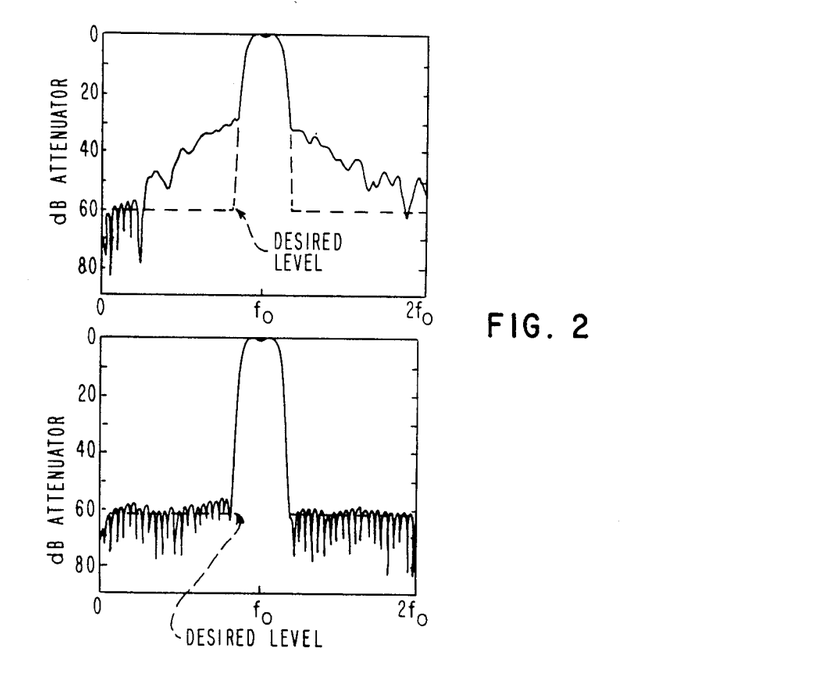
FIG. 2a is a graphic representation of a bandpass filter response with severe diffraction distortion.
FIG. 2b is a graphic representation of a bandpass filter response with no diffraction distortion.

Probably the most common type of Surface Acoustic Wave (SAW) device is the bandpass filter. A typical SAW filter consists of two interdigital transducers (IDT's) deposited on a piezoelectric substrate. Applying a voltage to the input transducer terminals results in an acoustic wave launched in each direction from the IDT. As the launched wave propagates over a free surface, the energy profile changes as shown in FIG. 1a. This spreading of energy, known as diffraction, primarily results in degradation of the near-in stop-band performance of a bandpass filter such as that shown in FIG. 2a. "Effect of Diffraction on the Design of Acoustic Surface Wave Device" Thomas Szabo and Andrew Slobodnik, *IEEE Transactions on Sonics and Ultrasonics*, Vol. SU-20, No. 30, July 1973.

A model describing free surface diffraction (FIG. 1a) has been used many times in diffraction compensation attempts. Since the actual wave is propagating under a transducer which is not a totally free surface, there has been limited success using model driven diffraction compensation techniques. The most successful diffraction compensation to date resulted from measured performance data used in the redesign of a given filter. This is, however, time consuming and expensive, as many times it takes several iterations to provide adequate results. If the diffracted beam profile could be accurately predicted, one could in principle compensate for the effects, thereby eliminating the distortion and approaching the performance shown in FIG. 2b.

The pertubing effects of the transducer structure on the diffraction of the acoustic wave can be modeled more accurately by treating the transducer structure as a waveguide.

Surface wave guiding can be attained by providing a continuous region on the surface of a substrate which is at least partially covered with metal. "Elastic Surface Wave Guidance Structures" A. James Hughes, *Journal of Applied Physics*, Vol. 43, No. 6, June 1972. The metalized portion of the piezoelectric surface results in a slowing of the wave velocity with respect to a wave propagating on a free surface. This region of slower velocity on the substrate surface channels the acoustic energy much as a fiber optic medium guides light energy. This method of guiding is commonly referred to as delta-v/v guiding.

Figure 4:
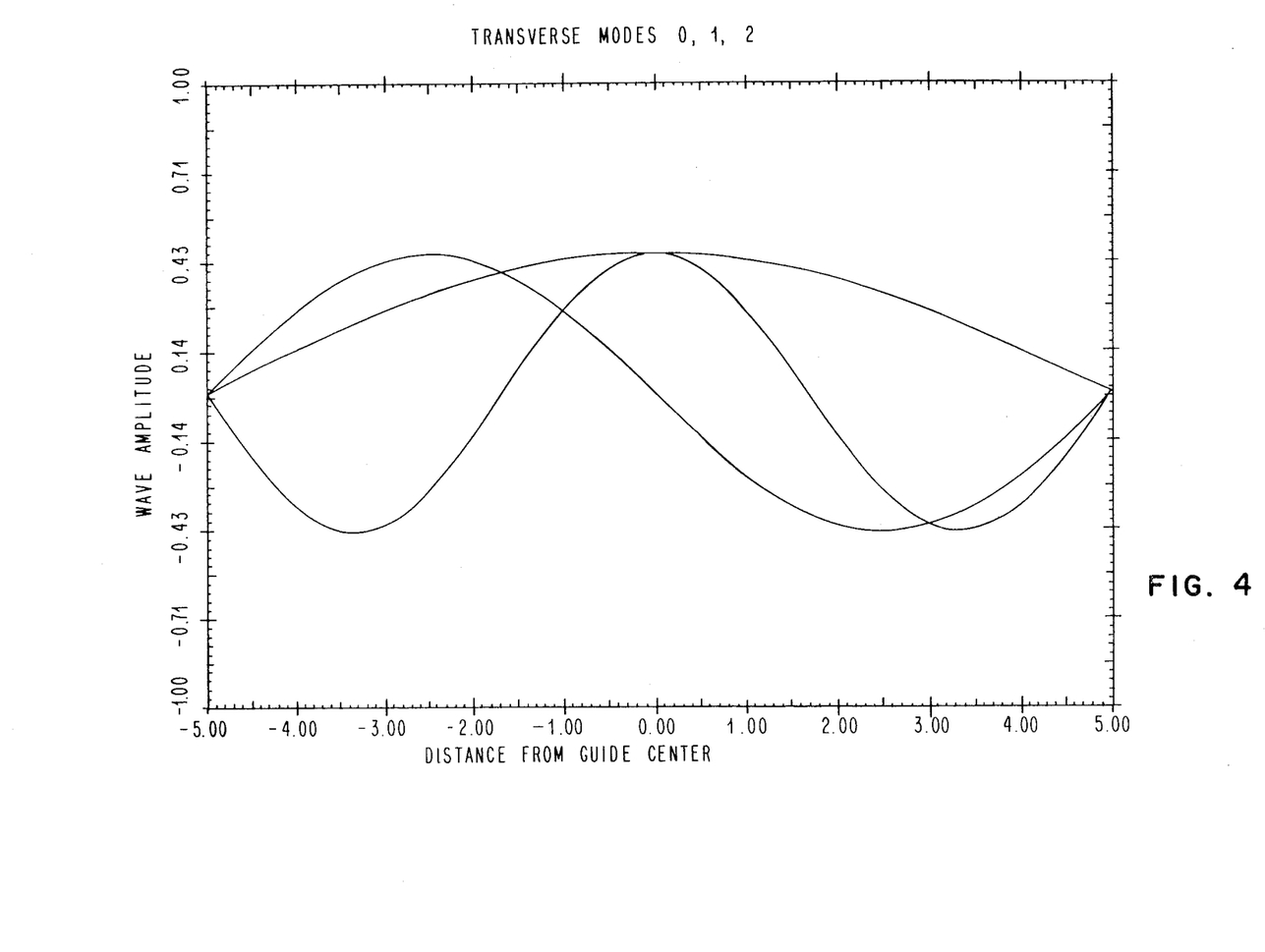
FIG. 4 is a graphical representation of typical waveguide modes.

From electromagnetic wave theory, it is well known that energy contained in guided structures is typically distributed over various modes. An approximate representation of the three lowest order modes are shown with respect to a ten wavelength guide in FIG. 4. Most of the wave energy generated from a normal SAW IDT is contained in the lowest mode (~80%), but the remaining energy in the higher modes causes significant distortion to the surface wave beam profile from the interaction between the various modes. This variation in beam profile due to multi-mode distortion can result in poor out of band performance similar to the diffraction distortion described above.

Delta-v/v wave guiding is used in other SAW devices for signal processing such as convolvers and correlators. These devices are not transversal filters nor does their use of waveguiding relate to bandpass filtering. The SAW resonator also uses a guide structure to create a surface resonate cavity. This again is for a different purpose and not related to filtering.

DISCLOSURE OF INVENTION

Figure 1B:
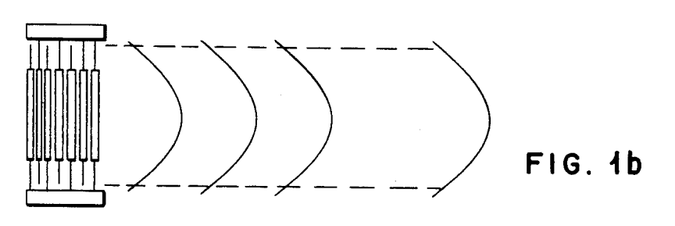
FIG. 1b is a graphic representation of a fundamental mode of a surface wave propagating in a waveguide.

In accordance with the present invention, a surface wave device includes a substrate having at least a surface layer of piezoelectric material and at least one pair of opposing electrically conducting pads disposed on the piezoelectric surface. In a common configuration of what is sometimes referred to as a three phase transducer or a unidirectional transducer, this would be two pairs of opposing electrically conducting pads. The invention also includes at least two electrodes disposed on the piezoelectric surface. At least one of the electrodes extends from each of the pads toward the opposing pad. The strength of the surface waves generated on the piezoelectric surface as a result of applying an electrical signal between the opposing pads varies significantly in a direction transverse to the opposing pads. This transverse weighting is applied in order to generate a single propagating mode (FIG. 1b).

In one arrangement, one of the opposing pads is undergrounded and at least one electrode extending from the undergrounded pad includes at least two segmented electrodes separated in a direction longitudinal to the opposing pads and an electrically conducting connecting bar joining at least two segmented electrodes. In some arrangements, electrically conducting connecting bars join the segmented electrodes at both ends.

In one arrangement, one of the opposing pads is grounded to a case which contains the device. At least one electrode extending from the grounded pad includes at least two segmented electrodes separated in a direction longitudinal to the opposing pads and electrically joined at one end by an electrically conducting connecting bar.

Figure 5:
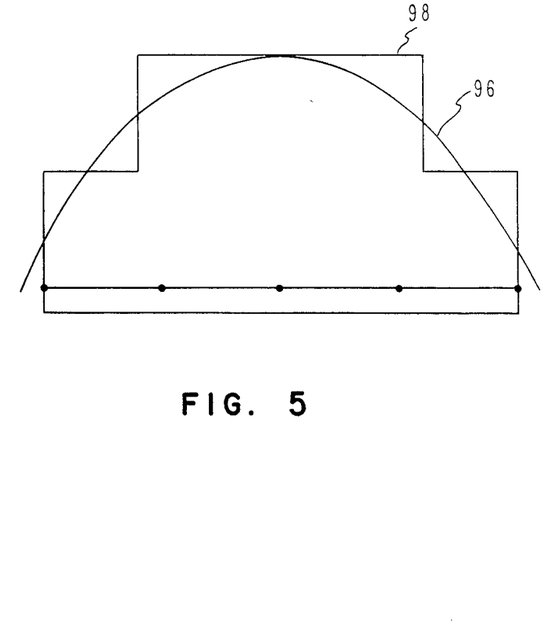
FIG. 5 is a graphical representation of a surface wave generated by the device of FIG. 8.
Figure 6:
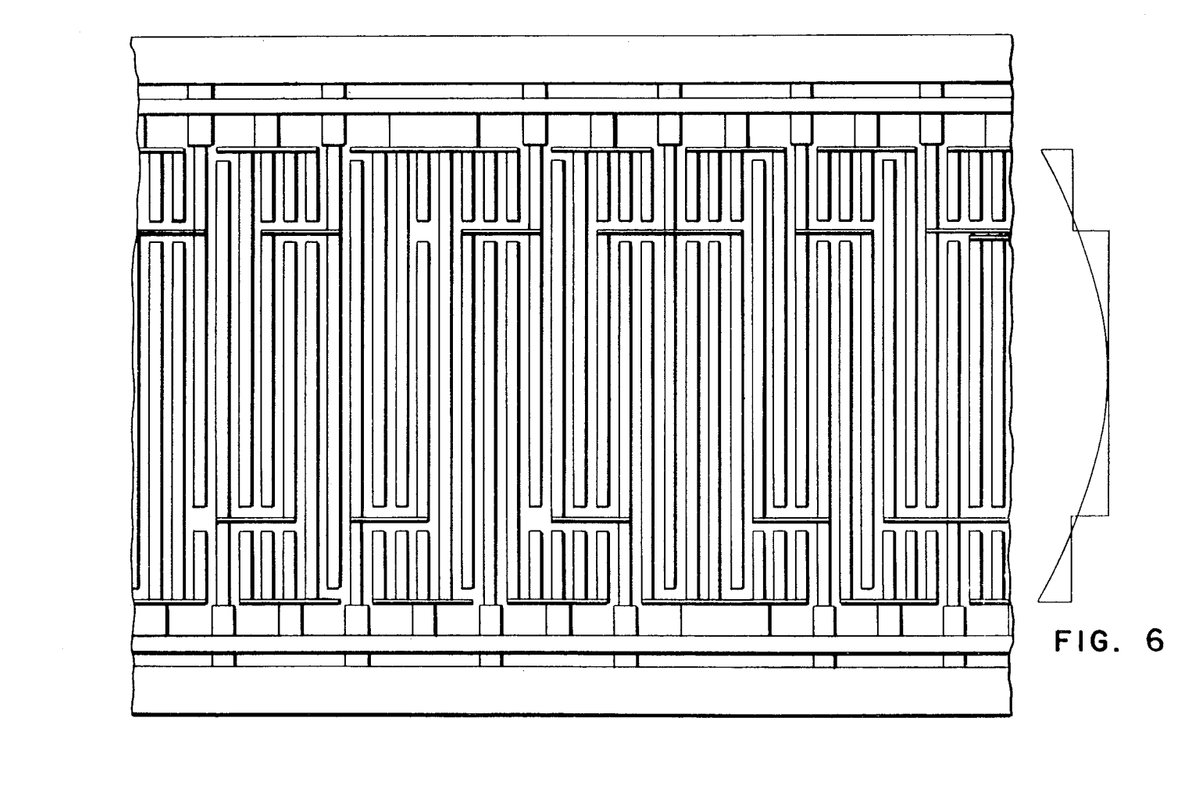
FIG. 6 is a surface wave device according to the present invention with a graphical representation of the wave generated.

In a preferred arrangement, both the launching and receiving transducers can be transversely matched to the lowest order mode using a three step approximation as shown in FIG. 5. A transversely weighted unidirectional transducer using electrode segmentation to achieve this 3 step match to the lowest mode is shown along with the desired mode profile in FIG. 6. This transducer will generate far more usable wave energy by concentrating the energy to the lowest propagating mode which in turn can be successfully received by an appropriate transversely weighted output transducer.

In a preferred arrangement, one of the opposing pads is grounded to the case and one of the opposing pads is ungrounded, and the at least one electrode extending from the ungrounded pad comprises segmented electrodes and connecting bars joining segmented electrodes to form an electrode array having more segmented electrodes near the center of the transverse distance between the opposing pads than near the pads. Conversely, the at least one electrode extending from the grounded pad includes segmented electrodes and connecting bars joining the segmented electrodes to form an electrode array having fewer segmented electrodes near the center of the transverse distance between the opposing pads than nearer the pads.

This transducer is used with an apodized output transducer with weighting for mode matching in addition to the desired weighting function for bandpass filtering. This combination results in a new family of filters utilizing waveguiding and mode matching to achieve superior performance in a space restrictive environment.

Figure 3:
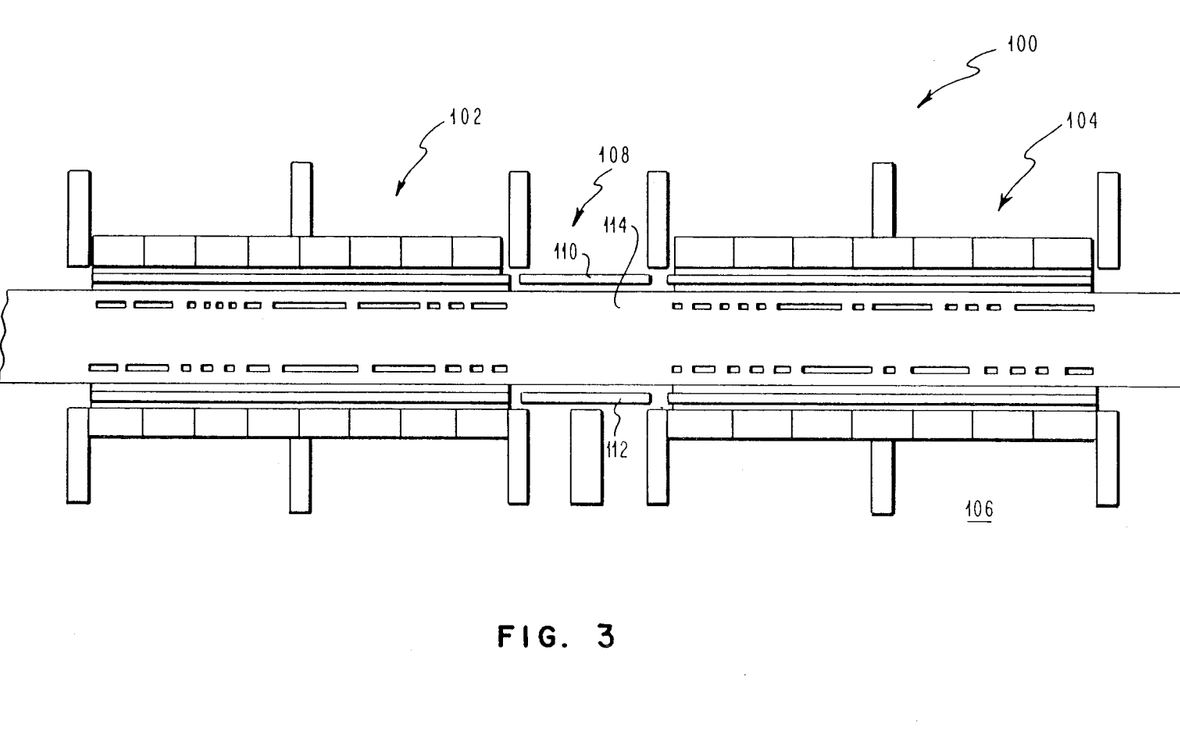
FIG. 3 is a surface wave device according to the present invention.

Referring to FIG. 3, a continuous structure guides the surface wave over the length of a SAW device. The two transducers make up much of the wave guide as they have metal distributed over 50% of their areas. The area between the two transducers is either continuously metalized or covered with the same periodicity as the two transducers. The remaining area at the ends of the transducers is covered with a continuous grating to complete the guide. The acoustic wave will now be primarily contained in the guide as it propagates over the substrate surface.

These and other objects, advantages and features of this invention will be apparent from the following description taken with reference to the accompanying drawing, wherein is shown in the preferred embodiments of the invention.

BEST MODE FOR CARRYING OUT THE INVENTION

Figure 7:
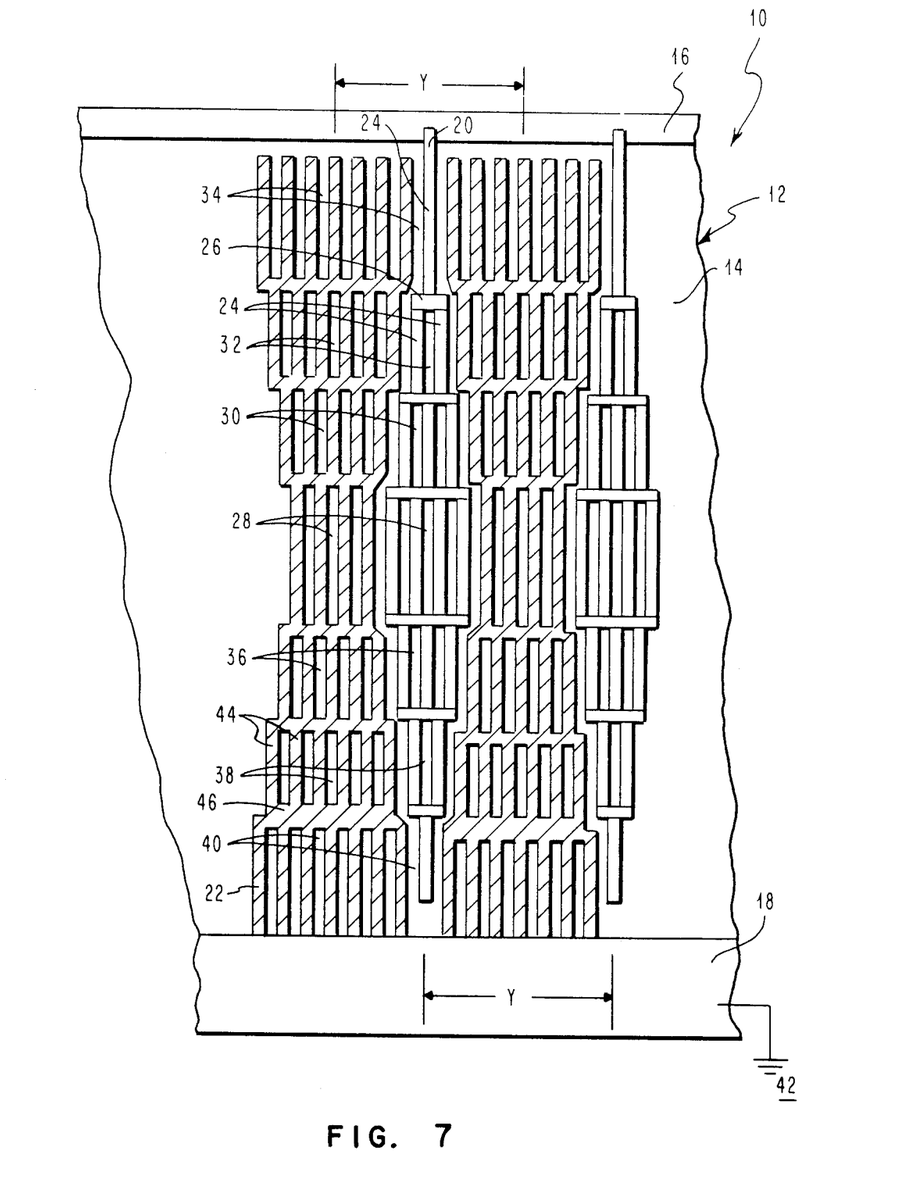
FIG. 7 is a surface wave device according to the present invention.

Referring now to the drawing, and in particular FIG. 7, the surface wave device according to the present invention is referred to generally by reference numeral 10. Surface wave device 10 includes substrate means 12 having at least a surface layer 14 of piezoelectric material and at least one pair of opposing electrically conducting pads 16 and 18. Surface wave device 10 further includes at least two electrodes 20 and 22 disposed on piezoelectric surface 14. At least one of the electrodes extends from each of the pads toward the opposing pad. In particular, electrode 20 is connected to pad 16 and extends toward, but is not connected to pad 18. Similarly, electrode 22 is connected to pad 18 and extends toward, but is not connected to pad 16. Pad 16 is ungrounded and electrode 20 includes at least two parallel segmented electrodes 24 separated in a direction longitudinal to opposing pads 16 and 18, and an electrically conducting connecting bar 26 joining the at least two segmented electrodes at one end. In a preferred arrangement, electrode 20 comprises segmented electrodes 24 and connecting bars 26 joining the segmented electrodes to form an electrode array having more segmented electrodes near the center 28 of the transverse distance between opposing pads 16 and 18 than near the pads such as 30 or 32 or 34 on the ungrounded pad side or 36, 38 or 40 on the grounded pad side. In the particular embodiment illustrated, the segmented electrode array has more segmented electrodes at the very center 28 than immediately adjacent at 30 or 36, and has more at 30 or 36 than the immediately adjacent positions near the pads, 32 and 38. Similarly there are more segmented electrodes at 32 and 38 than at the locations nearest the pads, 34 and 40.

In one arrangement of a surface wave device according to the present invention, for use with a case 42 for containing the device, opposing pad 18 is grounded to case 42, and electrode 22 extending from grounded pad 18 includes at least two segmented electrodes 44 separated in a direction longitudinal to opposing pads 16 and 18. An electrically conducting connecting bar 46 joins segmented electrodes 44 at one end. In a preferred arrangement, electrode 22 extending from grounded pad 18 includes segmented electrodes 44 and connecting bars 46 joining the segmented electrodes to form an electrode array having fewer segmented electrodes near the center 28 of the transverse distance between opposing pads 16 and 18 than near the pads such as at 30 or 32 or 34 which are nearer the ungrounded pad or 36 or 38 or 40 which are nearer the grounded pad. In a preferred arrangement, there are fewer segmented electrodes at the center section of the array 28 than in the immediately adjacent sections of the array 30 and 36, and there are fewer segmented electrodes at 30 and 36 than in the immediately adjacent sections of the array 30 and 38, which are nearer the pads, etc.

Figure 8:
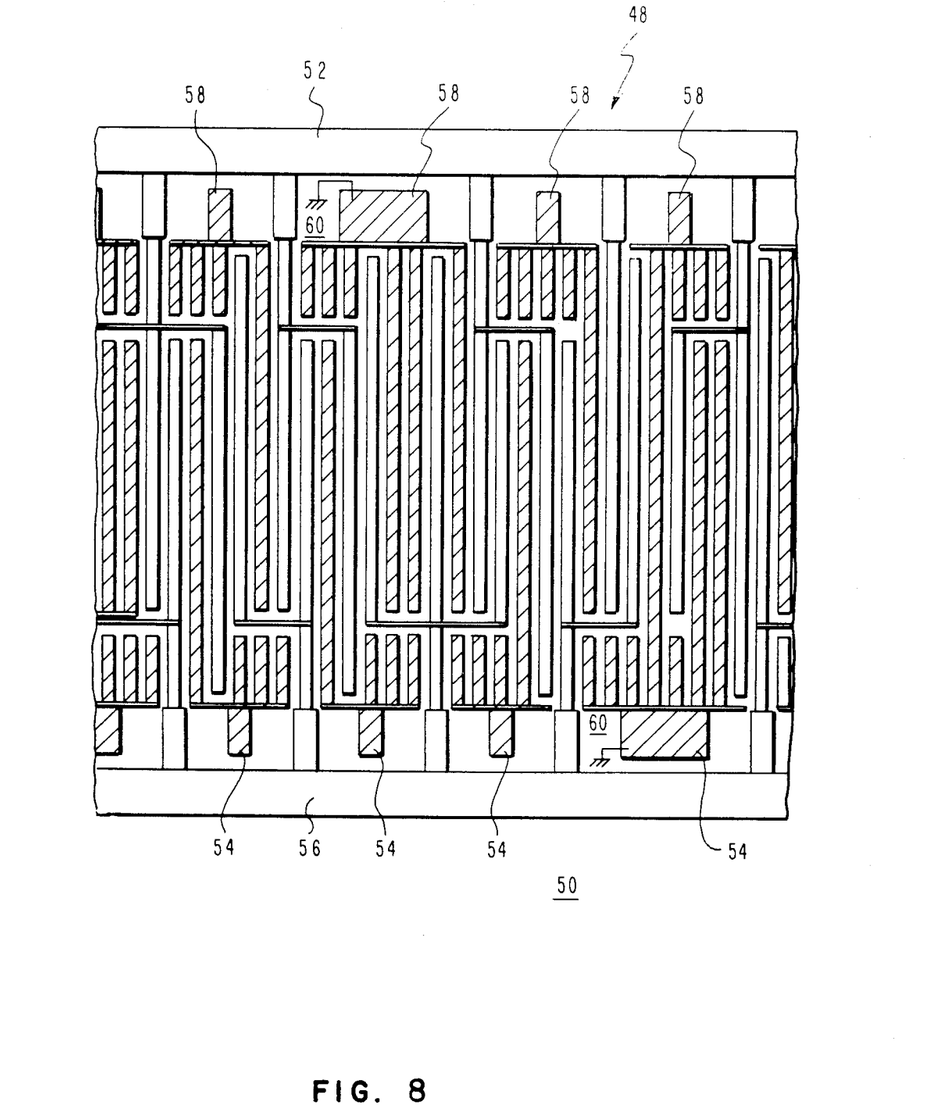
FIG. 8 is a unidirectional surface wave device according to the present invention.

Referring now to FIG. 8, a portion of a surface wave device according to the present invention which is known as a three-phase or unidirectional SAW device is referred to generally by reference numeral 48. SAW device 48 includes a substrate having at least a surface layer of piezoelectric material 50, a first pair of opposing electrically conducting pads 52 and 54 and a second pair of electrically conducting pads 56 and 58. Pads 54 and 58 are illustrated only in part since, in each case, the pad would be continuous bridging over the sections of pads 52 and 56 which are in the way. Pads 54 and 58 are grounded to a case 60, and pads 52 and 56 are ungrounded. At least two electrodes 62 and 64 are disposed on piezoelectric surface 50, at least one of which extends from each of the pads 52 and 54 toward the opposing pad. Electrode 62 extending from ungrounded pad 52 includes at least two segmented electrodes 66 and 68 separated in a direction longitudinal to opposing pads 52 and 54 and an electrically conducting connecting bar 70 joining the at least two segmented electrodes at one end. Segmented electrodes 66 and 68 form with the rest of electrode 62 an electrode array having three sections in a direction transverse to opposing pads 52 and 54. The center section extending from connecting bar 70 to the opposite end of segmented electrode 66 has two segmented electrodes whereas the two end sections of the array between the ends of segmented electrode 66 and the opposing pads have only one segmented electrode, being the end portion of segemented electrode 68 nearest grounded pad 54 and being the stem portion of electrode 62 nearest ungrounded pad 52.

Similarly, at least one electrode 64 extending from grounded pad 54 includes at least two segmented electrodes 72 through 84 separated in a direction longitudinal to opposing pads 52 and 54 and an electrically conducting connecting bar 86 joining the at least two segmented electrodes at one end. Segmented electrodes 72 through 84 form an electrode array having three sections. The center section is formed by segmented electrodes 78, 82 and 84, and the section of the array nearest grounded pad 54 is formed by all of the segmented electrodes 72 through 84. Segmented electrode 78 connects to segmented electrodes 88, 90 and 92 by means of connecting bar 94 so that the segment of the electrode array nearest to ungrounded electrode 52 is formed by segmented electrodes 78, 88, 90 and 92.

It can thus be seen that both surface wave device 10 and surface wave device 48 can be used as input transducer means operable to convert an input electrical signal to acoustic surface waves propagating on the piezoelectric surface of the substrate means. The strength of surface waves generated on the piezoelectric surface as a result of applying such an electrical signal between the opposing pads varies significantly in a direction transverse to the opposing pads. Referring now to FIG. 5, a graphical representation of an ideal lowest order mode surface acoustic wave is represented generally by reference numeral 96, and a step function approximation such as would be generated by a three section electrode array such as surface acoustic wave device 48 is represented by reference numeral 98. It can easily be seen that step function approximation 98 generated by surface wave device 48 eliminates many of the higher order of modes generated by conventional SAW devices.

Referring now to FIG. 3, another embodiment of a surface acoustic wave device according to the present invention is referred to generally by reference numeral 100. An input transducer means similar to surface wave device 48 is referred to by reference numeral 102. Surface wave device 100 further includes output transducer means 104 disposed on a piezoelectric surface 106 which is operable to convert acoustic surface waves propagating on the piezoelectric surface to an output electrical signal. Such output electrical signal would appear across the different pairs of opposing pads. Surface wave device 100 further includes means 108 for guiding surface acoustic waves between the input transducer and the output transducer. Means 108 includes an additional pair of opposed pads 110 and 112 which form a wave guide. Means 108 also includes a continuation of metallic finger structures 114 disposed transversely to opposing pads 110 and 112. Due to the scale of the illustration and the density of the metallic fingers, metallic fingers 114 appear to be a solid longitudinal line, but in reality are a plurality of transverse fingers.

From the foregoing it will be seen that this invention is one well adapted to attain all of the ends and objects hereinabove set forth, together with other advantages which are obvious and which are inherent to the appratuas.

It will be understood that certain features and subcombinations are of utility and may be employed without reference to other features and subcombinations. This is contemplated by and is within scope of the claims.

As many possible embodiments may be made of the invention without departing from the scope thereof, it is to be understood that all matter herein set forth or shown in the figures of the accompanying drawing is to be interpreted as illustrative and not in a limiting sense.

I claim:

1. A surface wave device comprising in combination:
   substrate means having at least a surface layer of piezoelectric material;
   at least one pair of opposing electrically conducting pads disposed on the piezoelectric surface; and
   at least two electrodes disposed on the piezoelectric surface, at least one of the electrodes extending from each of the pads toward the opposing pad wherein the strength of surface waves generated on the piezoelectric surface as a result of applying an electrical signal between the opposing pads varies significantly in a direction transverse to the opposing pads;
   wherein one of the opposing pads is ungrounded, and at least one electrode extending from the ungrounded pad comprises parallel segmented electrodes and connecting bars joining the segmented electrodes to form an electrode array having more segmented electrodes near the center of the transverse distance between the opposing pads than near either of the pads.

2. A surface wave device according to claim 1 for use with a case for containing the device wherein one of the opposing pads is grounded to the case and at least one electrode extending from the grounded pad comprises segmented electrodes and connecting bars joining the segmented electrodes to form an electrode array having fewer segmented electrodes near the center of the transverse distance between the opposing pads than near either of the pads.

3. A surface wave device according to claim 2 wherein the pads and electrodes form an input transducer means operable to convert an input electrical signal to acoustic surface waves propagating on the piezoelectric surface of the substrate means, the device further comprising an output transducer means disposed on the piezoelectric surface of the substrate means and being operable to convert acoustic surface waves propagating on the piezoelectric surface of the substrate means to an output electrical signal.

4. A surface wave device according to claim 3 further comprising means for guiding acoustic surface waves traveling on the piezoelectric surface between the input transducer means and the output transducer means.

5. A surface wave device according to claim 4 wherein the means for guiding acoustic surface waves comprises a plurality of finger structures between the input transducer and the output transducer and extending in a direction which is transverse to the primary direction of wave propagation.

6. A surface wave device according to claim 1 wherein the pads and electrodes form an input transducer means operable to convert an input electrical signal to acoustic surface waves propagating on the piezoelectric surface of the substrate means, the device further comprising an output transducer means disposed on the piezoelectric surface of the substrate means and being operable to convert acoustic surface waves propagating on the piezoelectric surface of the substrate means to an output electrical signal.

7. A surface wave device according to claim 6 further comprising means for guiding acoustic surface waves traveling on the piezoelectric circuit between the input transducer means and the output transducer means.

8. A surface wave device according to claim 7 wherein the means for guiding acoustic surface waves comprises a plurality of finger structures between the input transducer and the output transducer and extending in a direction which is transverse to the primary direction of wave propagation.

9. A surface wave device comprising in combination:
substrate means having at least a surface layer of piezoelectric material;
at least one pair of opposing electrically conducting pads comprising a first pad and a second pad disposed on the piezoelectric surface;
at least two parallel segmented electrodes forming part of a first electrode extending from the first pad toward the second pad, separated in a direction longitudinal to the opposing pads;
a first electrically conducting connecting bar forming part of the first electrode joining the at least two segmented electrodes at one end;
at least a third segmented electrode forming part of the first electrode connected to the first connecting bar and extending from the first connecting bar in a direction opposite to that of the at least two segmented electrodes;
at least two segmented electrodes forming part of a second electrode extending from the second pad toward the first pad, separated from each other and the at least a third segmented electrode forming part of the first electrode in a direction longitudinal to the opposing pads;
a second electrically conducting connecting bar forming part of the second electrode joining the at least two segmented electrodes at one end; and
at least a third segmented electrode forming part of the second electrode connected to the second connecting bar and extending from the second connecting bar in a direction opposite to that of the at least two segmented electrodes which form apart of the second electrode, wherein the at least a third segmented electrode is separated in a direction longitudinal to the opposing pads from the at least two segmented electrodes which form part of the first electrode;
wherein the strength of surface waves generated on the piezoelectric surface as a result of applying an electrical signal between the opposing pads varies significantly in a direction transverse to the opposing pads and the total number of segmented electrodes in a longitudinal direction is substantially constant substantially throughout a transverse direction.

10. A surface wave device according to claim 9 wherein the pads and electrodes form an input transucer means operable to convert an input electrical signal to acoustic surface waves propagating on the piezoelectric surface of the substrate means, the device further comprising an output transducer means disposed on the piezoelectric surface of the substrate means and being operable to convert acoustic surface waves propagating on the piezoelectric surface of the substrate means to an output electrical signal.

11. A surface wave device comprising in combination:
substrate means having at least a surface layer of piezoelectric material;
at least one pair of opposing electrically conducting pads disposed on the piezoelectric surface; and
a first plurality of parallel segmented electrodes disposed on the piezoelectirc surface: and
at least one connecting bar joining the segmented electrodes of the first plurality to form an electrode array having more segmented electrodes near the center of the transverse distance between the opposing pads than near either of the pads;
wherein the strength of surface waves generated on the piezoelectric surface as a result of applying an electrical signal between the opposing pads varies significantly in a direction transverse to the opposing pads.

12. A surface wave device according to claim 11 further comprising a second plurality of segmented electrodes and at least two connecting bars joining the segmented electrodes of the second plurality to form an electrode array having fewer segmented electrodes near the center of the transverse distance between the opposing pads than near either of the pads.

13. A surface wave device comprising in combination:
substrate means having at least a surface layer of piezoelectric material;
at least one pair of opposing electrically conducting pads disposed on the piezoelectric surface;
a first plurality of parallel segmented electrodes disposed on the piezoelectric surface; and
at least two connecting bars joining the segmented electrodes to form an electrode array having fewer segmented electrodes near the center of the transverse distance between the opposing pads than near either of the pads;
wherein the strength of surface waves generated on the piezoelectric surface as a result of applying an electrical signal between the opposing pads varies significantly in a direction transverse to the opposing pads.

* * * * *

UNITED STATES PATENT AND TRADEMARK OFFICE
CERTIFICATE OF CORRECTION

PATENT NO.   :  4,491,757
DATED        :  January 1, 1985
INVENTOR(S)  :  Clinton S. Hartmann It is certified that error appears in the above-identified patent and that said Letters Patent is hereby corrected as shown below:

In Column 7, line 38, "apart" should read ---part---

In Column 7, line 53, "transucer" should read ---transducer---

In Column 8, line 16, "piezoelectirc surface:" should read read ---piezoelectric surface;---

Signed and Sealed this

Twenty-eighth Day of May 1985

[SEAL]

Attest:

DONALD J. QUIGG

Attesting Officer    Acting Commissioner of Patents and Trademarks